United States Patent
Kanter et al.

(10) Patent No.: US 11,258,466 B1
(45) Date of Patent: Feb. 22, 2022

(54) SYSTEM AND METHOD FOR HIGH RELIABILITY FAST RAID SOFT DECODING FOR NAND FLASH MEMORIES

(71) Applicant: Kioxia Corporation, Tokyo (JP)

(72) Inventors: Ofir Kanter, Haifa (IL); Avi Steiner, Kiriat Motzkin (IL); Hanan Weingarten, Herzliya (IL)

(73) Assignee: Kioxia Corporation, Tokyo (JP)

( * ) Notice: Subject to any disclaimer, the term of this patent is extended or adjusted under 35 U.S.C. 154(b) by 42 days.

(21) Appl. No.: 16/819,025

(22) Filed: Mar. 13, 2020

(51) Int. Cl.
*H03M 13/45* (2006.01)
*G06F 11/10* (2006.01)

(52) U.S. Cl.
CPC ......... *H03M 13/45* (2013.01); *G06F 11/1068* (2013.01)

(58) Field of Classification Search
CPC .................................................... H03M 13/45
USPC ................ 714/807, 805, 808, 810
See application file for complete search history.

(56) References Cited

U.S. PATENT DOCUMENTS

| | | | | |
|---|---|---|---|---|
| 10,963,338 | B1 * | 3/2021 | Steiner | H03M 13/45 |
| 2013/0024605 | A1 * | 1/2013 | Sharon | G06F 11/1044 |
| | | | | 711/103 |
| 2015/0193157 | A1 * | 7/2015 | Hwang | G11C 29/52 |
| | | | | 714/764 |
| 2016/0274969 | A1 * | 9/2016 | Chen | H03M 13/3746 |
| 2017/0262333 | A1 * | 9/2017 | Weng | G11C 11/5642 |
| 2018/0024881 | A1 * | 1/2018 | Lu | G11C 11/5642 |
| | | | | 714/764 |
| 2019/0027214 | A1 * | 1/2019 | Yang | G11C 16/26 |
| 2019/0340069 | A1 * | 11/2019 | Kumar | G06F 11/1012 |

* cited by examiner

*Primary Examiner* — Fritz Alphonse
(74) *Attorney, Agent, or Firm* — Foley & Lardner LLP

(57) ABSTRACT

A flash memory system may include a flash memory and a circuit for decoding a result of a read operation on the flash memory using a first codeword. The circuit may be configured to generate first soft information of the first codeword. The circuit may be further configured to generate second soft information of a second codeword. The circuit may be configured to generate third soft information based on the first soft information and the second soft information. The circuit may be configured to decode the result of the read operation on the flash memory using the third soft information.

20 Claims, 14 Drawing Sheets

SYSTEM AND METHOD FOR HIGH RELIABILITY FAST RAID SOFT DECODING FOR NAND FLASH MEMORIES

TECHNICAL FIELD

The present embodiments relate generally to system and method for performing operations of a flash memory, and more particularly to system and method for system and method for decoding a result of a read operation on a flash memory using soft information generated based on soft information of a target codeword and soft information of other codewords.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

Due to different stress conditions (e.g., NAND noise and interference sources) during programming and/or read of the NAND flash memory, there may be errors in the programmed and read output. Improvements in decoding capabilities in such a wide span of stress conditions for NAND flash devices remain desired.

In NAND flash devices, soft sampling may be performed to generate soft information by changing read thresholds and reading a NAND flash device several times. Then, soft decoding is performed based on the soft information generated by the soft sampling. The NAND flash memory can be implemented using a RAID (Redundant Array of Inexpensive Drives or Redundant Array of Independent Drives) structure. Improvements in soft decoding capabilities in RAID for NAND flash devices remain desired.

SUMMARY

The present embodiments relate to system and method for decoding a result of a read operation on a flash memory using soft information generated based on soft information of a target codeword and soft information of other codewords.

According to certain aspects, embodiments provide a method for decoding a result of a read operation on a flash memory using a first codeword, may include generating first soft information of the first codeword. The method may further include generating second soft information of a second codeword. The method may further include generating third soft information based on the first soft information and the second soft information. The method may further include decoding the result of the read operation on the flash memory using the third soft information.

According to other aspects, embodiments provide a flash memory system including a flash memory and a circuit for decoding a result of a read operation on the flash memory using a first codeword. The circuit may be configured to generate first soft information of the first codeword. The circuit may be further configured to generate second soft information of a second codeword. The circuit may be configured to generate third soft information based on the first soft information and the second soft information. The circuit may be configured to decode the result of the read operation on the flash memory using the third soft information.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

According to certain aspects, embodiments in the present disclosure relate to techniques for decoding a result of a read operation on a flash memory using soft information generated by combining soft information of a target codeword and soft information of an estimated codeword generated based on other codewords.

Before describing problems to be solved by embodiments of the present disclosure, an example soft sampling process, an example soft decoding process, and an example RAID encoding and decoding will be described with reference to FIG. 1 to FIG. 4.

Figure 1:
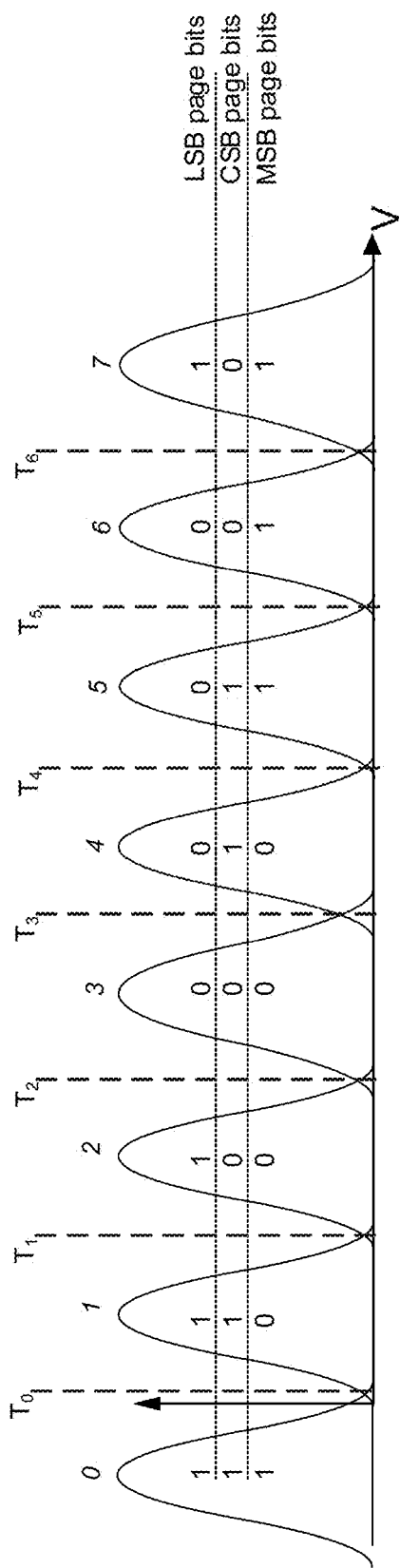
FIG. 1 illustrates threshold voltage distribution in a conventional three bits per cell (bpc) flash device.

FIG. 1 illustrates a superposition of the 8 possible voltage threshold distributions of a three bits per cell (bpc) flash memory device, e.g., a NAND device. The possible voltage threshold (VT) distributions of the cell have eight lobes, corresponding to the 8 different bit combinations of the three bits represented by the charge state of the cell. An MSB (most significant bit) page read requires using reference voltages (or read thresholds) T0, T4, to separate the lobes into those with MSBs of 0 and those with MSBs of 1. For reading CSB (center significant bit) pages the reference voltages T1, T3 and T5 are used. For reading LSB (least significant bit) pages the reference voltages T2 and T6 have to be used. The lower (left) most distribution is known as the erase level.

Due to different NAND noise and interference sources during programming and during read-out, there may be errors in programmed bits and read output. This may be due to programming errors, or errors during read with non-optimal thresholds or following retention/read-disturb stresses, etc. These noise sources result in errors on the information bits that are originally saved to the NAND device. A strong error correction code (ECC) can achieve faster programming, with possibly higher programming errors, under high stress conditions during read-out, and/or with lower complexity digital signal processing (DSP). There are other impairments that may lead to complete erasure of a physical page/row/block in a NAND device, e.g. a block becoming a "bad" block that is no-longer readable. If these impairments cannot be detected during programming, recovery of a non-readable area can be performed by various techniques including a RAID encoding (see FIG. 4), for example.

Figure 2:
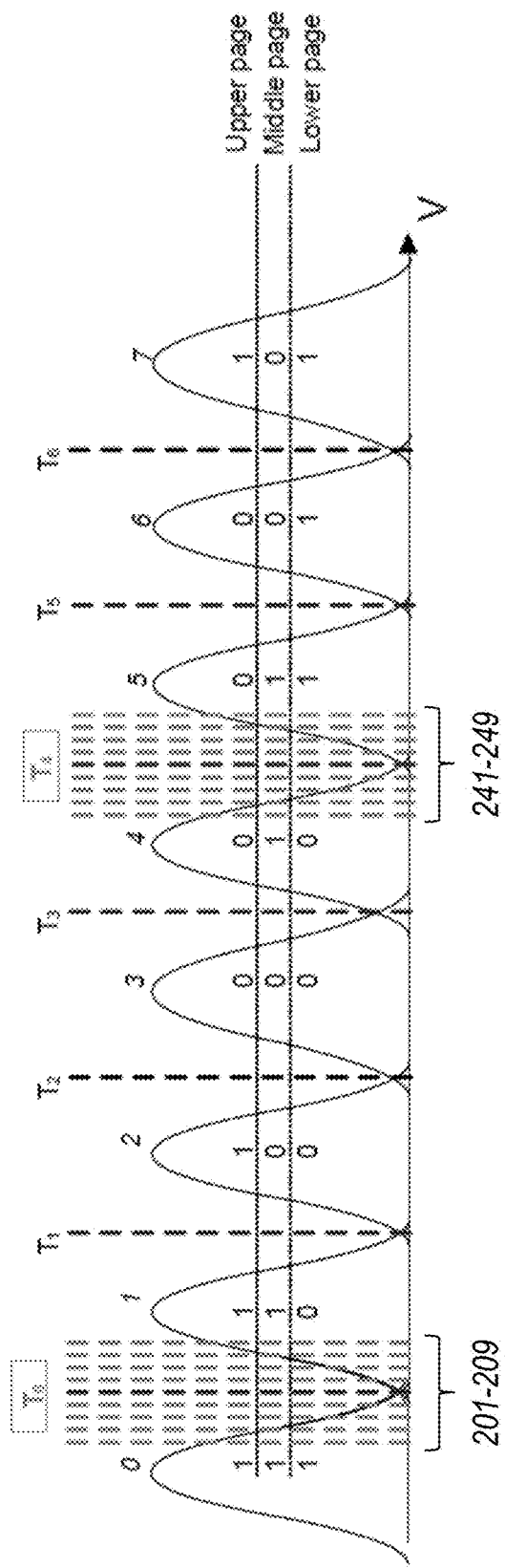
FIG. 2 illustrates an example process of soft sampling of a page of a flash device in a conventional three bpc flash device.

FIG. 2 illustrates an example process of soft sampling of a page of a flash device in a conventional three bpc flash device. In NAND devices, soft sampling is achieved by changing read thresholds and reading the NAND device several times. Soft sampling process may include several reads with different voltage levels around different thresholds. For example, as shown in FIG. 2, soft sampling process of a MSB of a NAND device includes reads with nine voltage levels 201-209 around the threshold T0 and reads with nine voltage levels 241-249 around the threshold T4.

Now, an example soft decoding process will be described. While a hard decoder decodes a message based on received bits (based on hard decision), soft input can be obtained by soft sampling, e.g., performing multiple reads from a flash device, where each read operation uses different read thresholds (see FIG. 2). The read thresholds may be configured such that soft information or soft metrics, e.g., log-likelihood ratio (LLR), can be computed per bit. An LLR is defined $$LLR(b_i) = \log\left(\frac{P(b_i = 1|y)}{P(b_i = 0|y)}\right) \quad \text{(Equation 1)}$$

where y is a channel output and $b_i$ is the $i^{th}$ bit of a page. The LLR expression can be substantially simplified, for an additive white Gaussian noise (AWGN) channel model. The AWGN is also a good approximation in many cases for lobes' distribution in a flash device (see FIG. 1). By assuming an AWGN channel, $$P(b_i | y) = \frac{1}{\sqrt{2\pi\sigma^2}} \exp\left(-\frac{(y-b_i^2)}{2\sigma^2}\right) \quad \text{(Equation 2)}$$

where y is the AWGN channel output. Using Equations 1 and 2, the $LLR(b_i)$ becomes $$LLR(b_i) = \frac{2y}{\sigma^2} \quad \text{(Equation 3)}$$

where the LLR per bit is created during multiple flash reads, as a quantized version of an AWGN channel. In some embodiments, the quantization level per threshold may be directly determined by the number of reads, as a base-two logarithm of a read counter.

After multiple reads have been conducted, once LLRs are available for all bits of codewords, a decoding process may begin. There are many possible approximations for LLR values' mapping for implementation efficiency, such as mapping to fixed point integer values. For product codes (i.e., a product code is n×n arrays where each column and row is a codeword in component code), there are several known decoding algorithms when soft information is available to a decoder. The general approach includes decoding each component code separately to generate output reliabilities per bit, which are applied and used for iterative decoding of the component code. For example, soft decoding of a BCH (Bose, Chaudhuri, and Hocquenghem) component code requires soft information per bit. Iterative soft decoding includes a process of performing soft decoding on some of code components, and applying the most likely corrections under different conditions. One approach for soft decoding is enumeration over low reliability bits, while trying to solve the BCH code per hypothesis [D. Chase, "A class of algorithms for decoding block codes with channel measurement information," IEEE Trans. Inf. Theory, vol. 18, n. 1, 1972, pp. 170-182.]. Other approaches include enumeration on least reliable bits together with assumptions that all errors are within a set of Q×t bits (t is the number of correctable bits, e.g., Q stands for the Galois field ($2^Q$) that is used for the code elements, e.g., Q=10), and perform erasure decoding. Q and t are part of the parameters of the code, and Q×t is the number of parity bits of the codeword. This approach is known as ordered statistics decoding [M. Fossorier and S. Lin, "Soft-decision decoding of linear block codes based on ordered statistics," IEEE Trans. Inf. Theory, vol. 41, pp. 1379-1396. September 1995]. If the BCH component codes with decoding capability of t<4 are used, then soft decoding may be efficiently implemented in terms of computational complexity, or implemented in hardware implementation, as per hypothesis a solution may directly be computed using a syndrome lookup table (LUT). When performing any type of soft decoding for a component code, it includes creating a list of candidates of the most likely error hypotheses for valid codeword corrections. A soft score for every result of valid codeword can be computed by $$S_{LLR} = \sum_{b_m \in C} |LLR(b_m)| \quad \text{(Equation 4)}$$

where C is the set of error bits, and $b_m$ is a location of an error bit. Usually, the selected error hypothesis of a soft component decoder has the smallest $S_{LLR}$ score.

Figure 3:
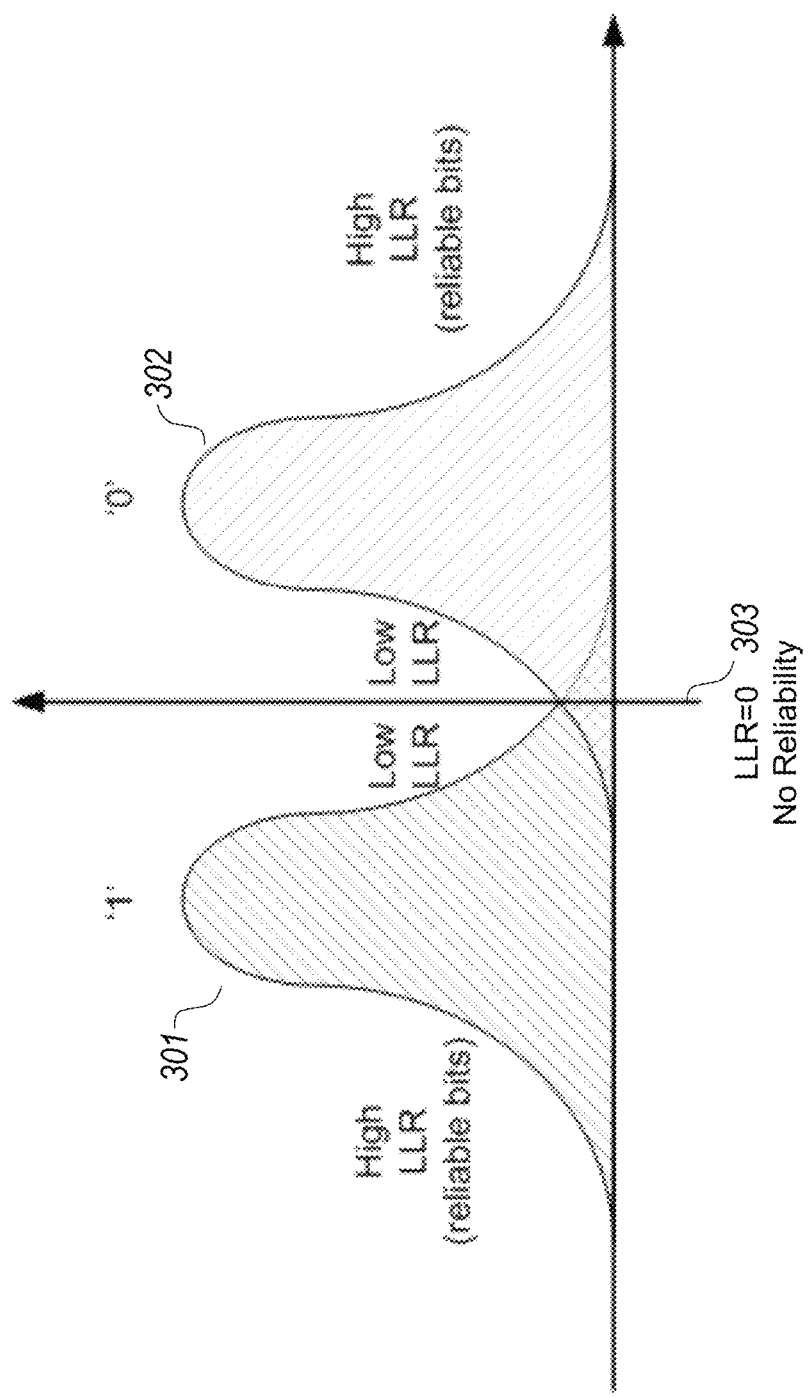
FIG. 3 illustrates an example histogram of log-likelihood ratios (LLRs) over a single threshold.

FIG. 3 illustrates an example histogram of log-likelihood ratios (LLRs) over a single threshold 303. The histogram of LLRs includes a left lobe 501 corresponding to ($b_i$=1) and a right lobe 302 corresponding to ($b_i$=0). LLR has a zero value at the single threshold 303. In the left lobe 301, the left side indicates high LLR values (more reliable bits) for $b_i$=1, while the right side indicates low LLR values (less reliable bits) for $b_i$=1. In the right lobe 302, the left side indicates low LLR values (less reliable bits) for $b_i$=0, while the right side indicates high LLR values (more reliable bits) for $b_i$=0.

Figure 4:
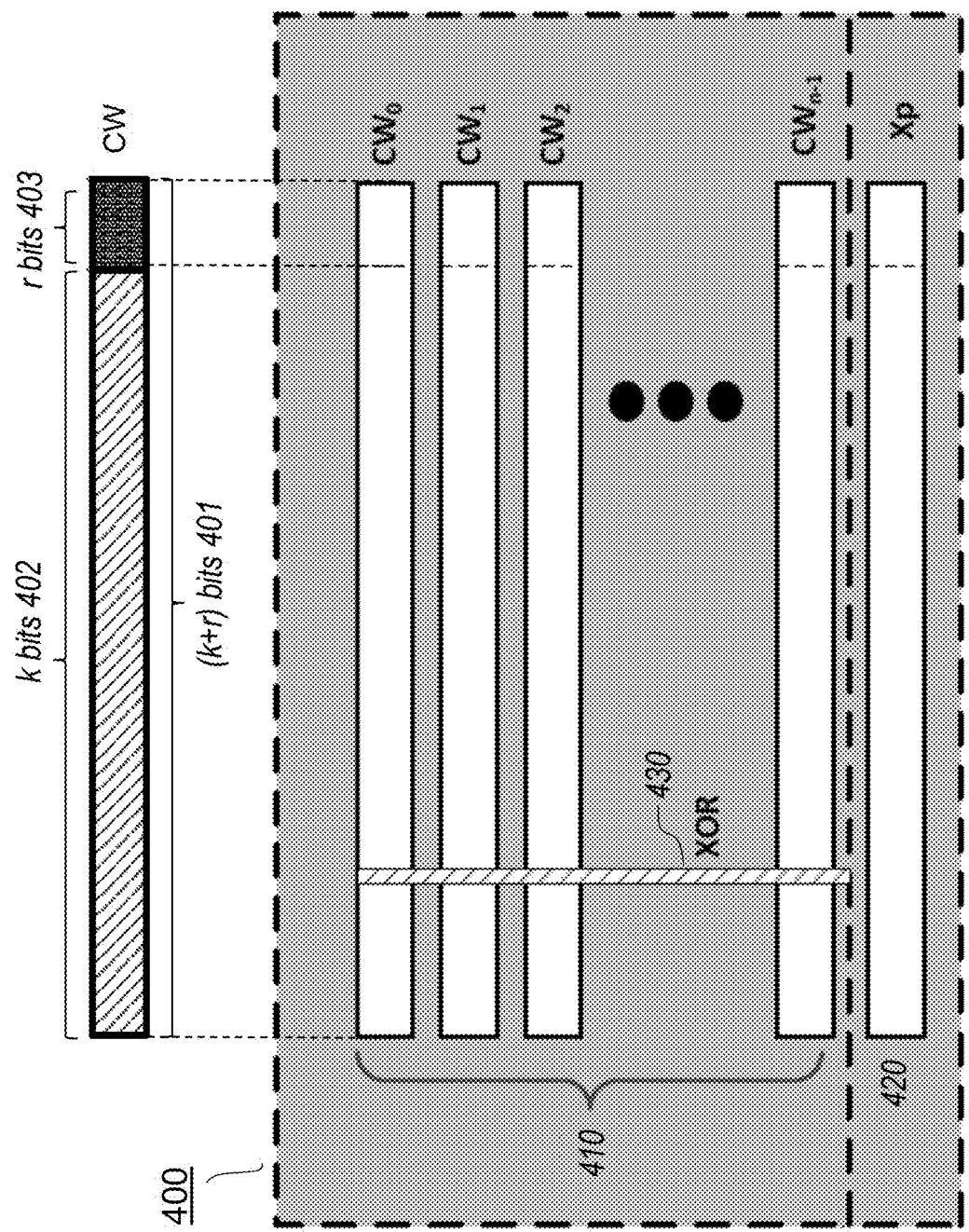
FIG. 4 illustrates an example codeword structure in a RAID system and an example process of RAID encoding and decoding.

FIG. 4 illustrates an example codeword structure in a RAID system 400 and an example process of RAID encoding/decoding. RAID encoding/decoding is used for increasing reliability and decoding capability at high BER with a low complexity additional encoding, and a low complexity decoding of long codewords effectively. An example for such encoding can be creating a long codeword using short codewords (e.g., n short codewords 410 including codewords $CW_0$-$CW_{n-1}$ in FIG. 4) and also storing a result of exclusive or (XOR) 430 of all short codewords $CW_0$-$CW_{n-1}$ as an additional short codeword (e.g., parity codeword Xp 420 in FIG. 4). This encoding can reduce the overall code-rate, but its impact may be very small for XOR with many codewords. This approach is known as RAID coding [Patterson, David; Gibson, Garth A.; Katz, Randy (1988). A Case for Redundant Arrays of Inexpensive Disks (RAID). SIGMOD Conferences]. The RAID approach originates from hard drives, which can be used as redundancy storage for allowing recovery of failed disks. There are many known solutions for redundant storage using RAID encoding with an overhead that depends on the expected system stability and failure rate. A code rate of a codeword is defined by a ratio of its information content, called payload, to the overall size of the codeword. For example, as shown in FIG. 4, for a codeword 401 that contains k bits 402 and r redundancy bits 403, the code rate is defined by R=k/(k+r). The common encoding methods are not very well suited to support high rate codes when both hard and soft decoding are considered. For example, for conventional low-density parity-check (LDPC) codes for very high rates (say 0.9), the code length tends to be considerable, resulting in a very complex and costly implementation.

Referring to FIG. 4, in the RAID system 400, there are n short codewords 410 ($CW_0$-$CW_{n-1}$) where each short codeword has a code rate R, and a parity codeword 420 (Xp) which is an XOR of all other codewords ($CW_0$-$CW_{n-1}$). In this case, the overall encoding rate $R_{raid}$ of the RAID protected data is $$R_{raid} = \frac{n}{(n+1)} \cdot R \quad \text{(Equation 5)}$$

which is very close to R for a large number n. FIG. 4 illustrates a simple RAID encoding which is performed over short codewords, where each codeword may be stored in different pages, or blocks or dies of a single storage NAND memory, and the parity codeword may be stored on the n-th device. The RAID encoding scheme can be defined as $$x_p = x_0 \oplus x_1 \oplus x_2 \oplus \ldots \oplus x_{n-1} \quad \text{(Equation 6)}$$

where $x_i$ is a short codeword, and $x_p$ is the parity codeword generated by bitwise XOR of all short codewords. In linear codes, the parity codeword $x_p$ is also a valid codeword, and may also be denoted by $x_n$. In case that one component ('i' component) cannot be decoded (due to high BER), and all other components in RAID are decoded, XOR operation can be used, and fix all errors in the 'i' component. However, in case that one component ('i' component) cannot be decoded (due to high BER), and more than one component in RAID cannot be decoded successfully, XOR operation cannot be used in order to fix errors.

It is possible to combine information from a target codeword and RAID in order to obtain a better estimator than the target codeword. The paper [E. Sharon, I. Ilani, I. Alrod "Leveraging RAID for Soft BCH Decoding", 10th annual non-volatile memories Workshop (NVMW), San-Diego, Mar. 10-12, 2019] describes a simple method of combining 2 bits information from a target codeword with 1 bit information from an XOR estimator codeword, and performing hard decoding on the combined codeword.

Now, problems to be solved by embodiments of the present disclosure will be described.

In a conventional RAID encoding/decoding scheme, in case that a target codeword among n codewords cannot be decoded (due to high BER, for example) and other codewords (which are more than one codeword) in RAID also cannot be decoded successfully, XOR operation cannot be used to fix errors in the target codeword. This situation impairs the soft decoding, and causes degradation in soft decoding capabilities, e.g., error correction capabilities, decoding reliability, endurance and resilience to retention and read-disturb stresses.

To solve these problems, according to certain aspects, embodiments in the present disclosure relate to methods for obtaining higher error correction capability of RAID decoding based on soft sampling of each element of the RAID (e.g., a codeword). In some embodiments, soft samples from all RAID elements (e.g., codewords) may be combined to generate soft information so that soft decoding can perform correction of high raw-BER (bit error rate) pages using the soft information.

In some embodiments, a method for obtaining high error correction capability via soft decoding in RAID may include (1) extracting soft information for a target codeword by soft sampling, for example; (2) generating an estimated codeword for estimating a target codeword based on soft information of other codewords in RAID (e.g., all codewords in RAID other than the target codeword); (3) generating a combined codeword based on the target code-word and the estimated codeword; and (4) generating soft information (e.g., LLRs) by coherently combining soft information of the target codeword and soft information of the estimated codeword.

The error correction capability of methods of soft decoding according to some embodiments can be further improved by various techniques (e.g., calibration, optimizations, dynamic re-ordering of codewords, partial decoding). In some embodiments, weights on soft information of the target codeword and soft information of the estimated codeword can be optimized to improve a coherent combining operation by a calibration process which is executed offline. In some embodiments, the calibration process may be based on channel conditions and/or number of failed code-words in RAID in order to improve error correction capability. In some embodiments, in generating soft information for a candidate codeword, dynamic re-ordering of codewords in RAID (successive RAID decoding) can be performed for improved reliability (see FIG. 12 and FIG. 13). In some embodiments, a trade-off between the total code rate $R_{RAID}$ and the error correction capability of soft decoding can be utilized by adjusting the total code rate $R_{RAID}$ and the number of codewords in RAID. In some embodiments, in order to improve error correction capability, the target codeword or other codewords in RAID that failed to be decoded can be partially decoded or LLR of part of the bits of the codewords can be partially fixed.

According to certain aspects, embodiments in the present disclosure relate to a method for decoding a result of a read operation on a flash memory using a first codeword. The method may include generating first soft information of the first codeword. The method may further include generating second soft information of a second codeword. The method may further include generating third soft information based on the first soft information and the second soft information. The method may further include decoding the result of the read operation on the flash memory using the third soft information.

According to certain aspects, embodiments in the present disclosure relate to a flash memory system including a flash memory and a circuit for decoding a result of a read operation on the flash memory using a first codeword. The circuit may be configured to generate first soft information of the first codeword. The circuit may be further configured to generate second soft information of a second codeword. The circuit may be configured to generate third soft information based on the first soft information and the second soft information. The circuit may be configured to decode the result of the read operation on the flash memory using the third soft information.

Embodiments in the present disclosure have at least the following advantages and benefits.

First, embodiments in the present disclosure can provide improved or increased reliability in RAID via soft decoding in addition to providing erasure recover capability of the RAID. For example, in case that a target codeword among n codewords cannot be decoded and other codewords (which may be more than one codeword) in RAID also cannot be decoded successfully, embodiments in the present disclosure can fix errors in the target codeword by generating soft decoding not only based on soft information of the target codeword but also based on soft information of other codewords in RAID (other than the target codeword).

Second, embodiments in the present disclosure can provide higher endurance and better resilience to retention and read-disturb stresses. By soft sampling of a target codeword and other codewords, correction of higher raw-BER (bit error rate) pages is enabled, as required for NAND Flash memories, thereby achieving error correction capability higher than the error correction capability that conventional soft decoding methods have typically achieved.

Third, high decoding reliability and high error correction capability can be obtained by generating a new codeword based on a unique combination of jointly encoded codewords in RAID. Such unique combination of codewords can result in a new codeword having a more precise information, reduced BER, better soft information, and thus when obtaining soft decoding on the new codeword, the error correction capability can be improved compared to using the original target codeword only.

Fourth, sub-optimal low complexity methods for computing soft information of a new codeword (e.g., LLR values generated based on LLR values of the target codeword and LLR values of an estimated codeword) can be provided by various techniques, e.g., calibration, optimizations, dynamic re-ordering of codewords, partial decoding. In some embodiments, such sub-optimal low complexity methods can utilize a simple implementation in hardware or software be implemented (e.g., hardware implementation with a low gate count).

Figure 5:
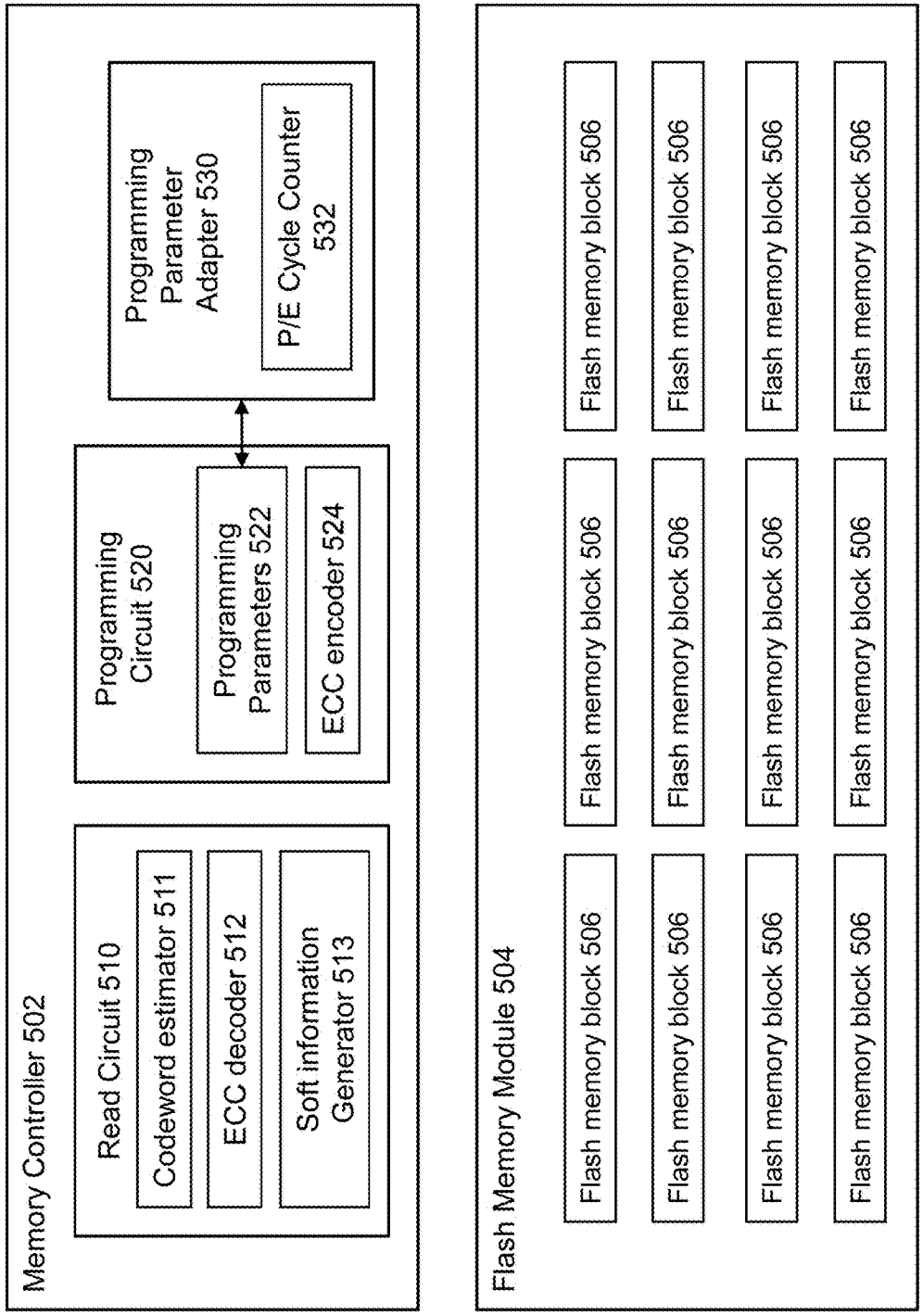
FIG. 5 is a block diagram illustrating an example flash memory system according to some embodiments.

FIG. 5 is a block diagram illustrating an example flash memory system 500 according to some embodiments, which can perform any of the methods described in the present disclosure.

The flash memory system 500 may include a flash memory module or flash memory device 504 and a memory controller 502. The flash memory module 504 may include multiple flash memory blocks 506, each of which includes multiple flash memory rows/pages (not shown). In some embodiments, each of the multiple flash memory rows/pages may have a plurality of cells. Additionally or alternatively, the module 504 can comprise or be implemented using a plurality of dies, each of the dies containing a plurality of the blocks 506.

The memory controller 502 may include a read circuit 510, a programming circuit (e.g. a program DSP) 520 and a programming parameter adapter 530. As shown in FIG. 5, the adapter 530 can adapt the programming parameters 522 used by programming circuit 520 as described above. The adapter 530 in this example may include a Program/Erase (P/E) cycle counter 532. Although shown separately for ease of illustration, some or all of the adapter 530 can be incorporated in the programming circuit 520. In some embodiments, the read circuit 510 may include a codeword estimator 511, an ECC decoder 512 and/or a soft information generator 513. In some embodiments, the programming circuit 520 may include an ECC encoder 524. Embodiments of memory controller 502 can include additional or fewer components such as those shown in FIG. 5.

In some embodiments, a flash memory system (e.g., the flash memory system 500 in FIG. 5) may include a cell flash memory (e.g., the flash memory module 504 or a flash memory block 506 in FIG. 5) and a circuit (e.g., the read circuit 510 or the programming circuit 520 in FIG. 5) for performing operations of the plurality of cells. In some embodiments, the flash memory module 504 may have a plurality of cells. In some embodiments, each of the flash memory blocks 506 may have a plurality of cells. In some embodiments, the codeword estimator 511 of the read circuit 510 may be configured to generate an estimated codeword based on a result of hard decoding a target codeword and a result of hard decoding codewords other than the target codeword. Methods of generating an estimated codeword by the codeword estimator 511 according to some embodiments will be described below with reference to FIG. 7 to FIG. 13. In some embodiments, the soft information generator 513 of the read circuit 510 may be configured to generate soft information based on the estimated codeword generated by the codeword estimator 511 and the target codeword. Methods of generating soft information by the soft information generator 513 according to some embodiments will be described below with reference to FIG. 7 to FIG. 13. The read circuit 510 may be configured to perform a read operation on the first cell and decode, via the ECC decoder 512, a result of the read operation on the first cell based on the soft information.

In some embodiments, the cell flash memory (e.g., the flash memory module 504 or a flash memory block 506 in FIG. 1) may include rows and columns of the plurality of cells. In some embodiments, a flash memory block 706 may include a plurality of pages (not shown) and a page may be defined as cells linked with the same word line, which correspond to a row of cells. In some embodiments, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 6:
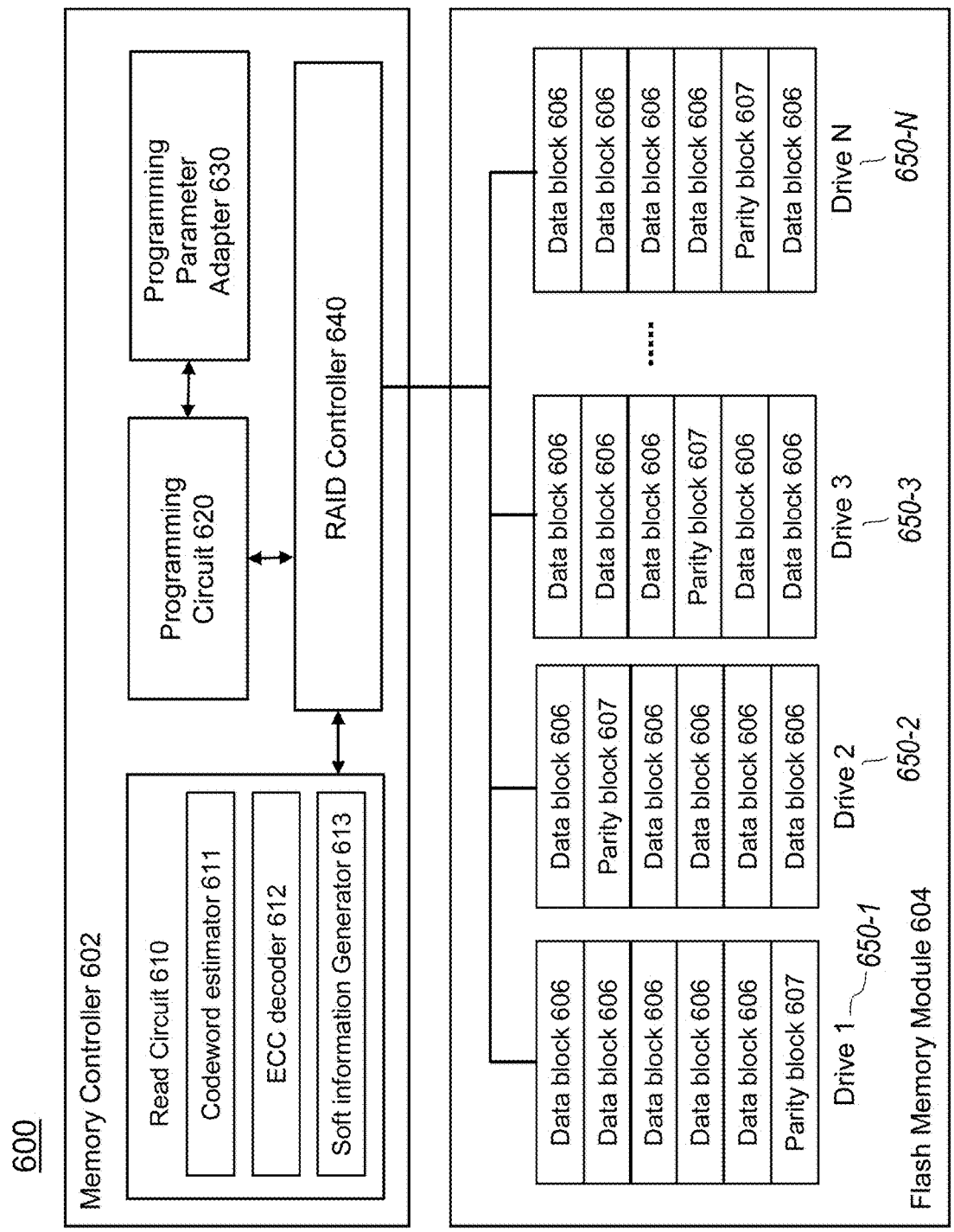
FIG. 6 is a block diagram illustrating an example flash memory system using a RAID (Redundant Array of Inexpensive Drives or Redundant Array of Independent Drives) structure, according to some embodiments.

FIG. 6 is a block diagram illustrating an example flash memory system using a RAID (Redundant Array of Inexpensive Drives or Redundant Array of Independent Drives) structure, according to some embodiments, which can perform any of the methods described in the present disclosure.

The flash memory system 600 may include a flash memory module or flash memory device 604 and a memory controller 602. The flash memory module 604 may include RAID which includes multiple redundant blocks in different drives (e.g., drive 1 (650-1) to drive N (650-N) in FIG. 6). Each drive may include a plurality of data blocks 806 and at least one parity block 607. In some embodiments, the RAID of the flash memory module 804 may be configured to stripe block-level data (e.g., data in data blocks 606) across drives of the RAID (e.g., drives 1-N) and write parity data (e.g., parity data in parity blocks 607) equally across all drives.

The memory controller 602 may include a read circuit 610, a programming circuit 620 and a programming parameter adapter 630, which are similarly configured to the read circuit 610, programming circuit 620 and programming parameter adapter 630 of the memory controller 602, respectively. In some embodiments, the read circuit 610 and the programming circuit 620 perform operations (e.g., encoding or decoding operations) on the blocks in drives 1-N via a RAID controller 640. The RAID controller 615 may be hardware (e.g., a circuit or a RAID card), firmware or software that can control or manage data redundancy between drives (e.g., Drives 1-N in FIG. 6) and/or performance of the RAID of the flash memory module 604. In some embodiments, the read circuit 612 may include a codeword estimator 611, an ECC decoder 612 and/or a soft information generator 613 which are similarly configured to the codeword estimator 511, ECC decoder 512 and/or soft information generator 513 of the read circuit 510, respectively. In some embodiments, the codeword estimator 611 of the read circuit 610 may be configured to generate an estimated codeword based on a result of hard decoding a target codeword stored in a data block in a drive (e.g., a target data block 606 in the drive 1) and a result of hard decoding codewords other than the target codeword stored in data blocks in that drive (e.g., data blocks 606 other than the target data block in the drive 1). Methods of generating an estimated codeword by the codeword estimator 611 according to some embodiments will be described below with reference to FIG. 7 to FIG. 13. In some embodiments, the soft information generator 613 of the read circuit 610 may be configured to generate soft information based on the estimated codeword generated by the codeword estimator 611 and the target codeword (e.g., the target data block 606 in the drive 1). Methods of generating soft information by the soft information generator 613 according to some embodiments will be described below with reference to FIG. 7 to FIG. 13. Embodiments of memory controller 602 can include additional or fewer components such as those shown in FIG. 6.

Figure 7:
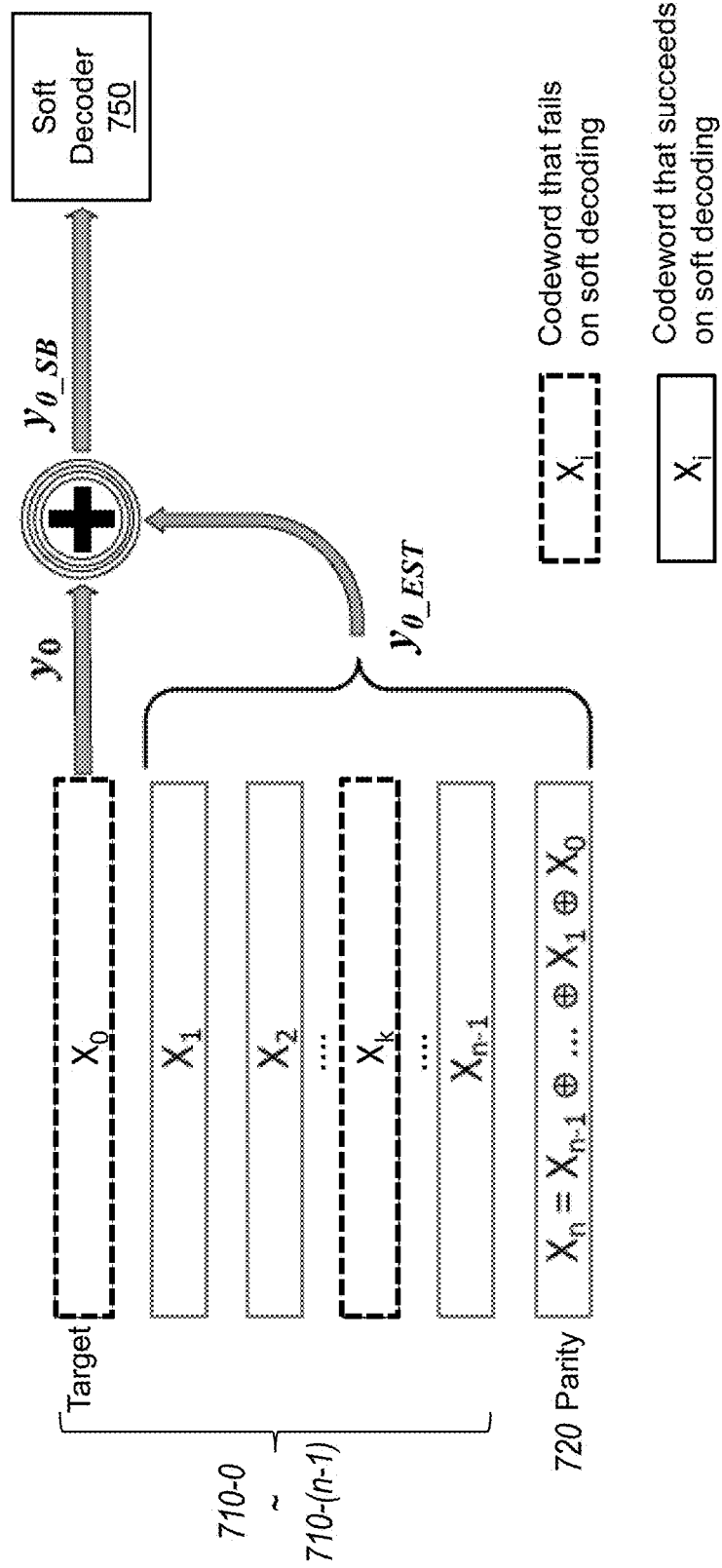
FIG. 7 illustrates an example process of generating soft information by combining soft information of a target codeword and soft information of an estimated codeword in a RAID system, according to some embodiments.

FIG. 7 illustrates an example process of generating soft information by combining soft information of a target codeword and soft information of an estimated codeword in a RAID system, according to some embodiments, which can perform any of the methods described in the present disclosure.

In the following descriptions, systems and methods of soft decoding based on a combination of soft information of a target codeword and soft information of an estimated codeword will be described with the assumption that codewords are stored in one or more drive in RAID (see FIG. 6). However, embodiments of the present disclosure are not limited to a flash device including a RAID structure. In some embodiments, soft decoding based on a combination of soft information of a target codeword and soft information of an estimated codeword may be implemented in a flash device that does not include a RAID structure (e.g., the flash memory module 504 in FIG. 5) by implementing data blocks and parity blocks separately in the flash device.

Referring to FIG. 7, in some embodiments, a plurality of codewords 710-0 to 710-(n-1) (e.g., $x_0$-$x_{n-1}$) may be stored in data blocks in a drive of RAID (e.g., data block 606 in drive 1 in FIG. 6) and a parity codeword 720 (e.g., $x_n$) may be stored in a data block in that drive of RAID (e.g., parity block 607 in drive 1 in FIG. 6).

In some embodiments, decoding of a target codeword, e.g. $x_0$, stored in a data block of RAID (e.g., data block 606 in drive 1 in FIG. 6) may fail on soft decoding, and the RAID codewords, e.g., $x_1$-$x_{n-1}$, stored in other data blocks of RAID (e.g., data blocks in drive 1 other than that of the target codeword in FIG. 6), can be used for successfully recovering the failed codeword. In some embodiments, soft information (e.g., LLRs) of the failed short codewords may be combined, such that nearly optimal LLR input can be provided to a soft-decoder (e.g., a soft decoder 750 in FIG. 7, the ECC decoder 512 in FIG. 5, the ECC decoder 612 in FIG. 6) and the soft decoder can perform soft decoding of the target codeword (e.g., $x_0$) more reliably than using soft information generated only based on the target codeword. This method will be explained through the following example:

It is assumed that the bits of $x_i \in \{0,1\}$ and that the soft input to the decoder can be a failed (noisy) version of codeword $y_i = x_i + w_i$ where $w_i$ is a noise vector that can represent a continuous noise. The noise may be either additive white Gaussian noise (AWGN), or any distribution corresponding to a NAND device or stress conditions. For example, without loss of generality, a target codeword $x_0$ fails on soft decoding, and when attempting to read and (soft) decode all the other codewords of the RAID (e.g., $x_1$-$x_{n-1}$), only $x_k$ ($1 \le k \le (n-1)$) fails on decoding, as shown in FIG. 7.

Now, from all the codewords that decoded successfully (e.g., $x_1$-$x_{n-1}$ except $x_k$) and the failed codeword $y_k$, an estimated version of $x_0$, denoted by $y_{0\_EST}$, can be computed by:

$$y_{0\_EST} = (x_1 \oplus x_2 \ldots \oplus x_{k-1} \oplus x_{k+1} \ldots \oplus x_n) \oplus y_k \quad \text{(Equation 7)}$$

It is noted that in the present disclosure, ⊕(XOR operation) on '−1' value has the same functionality as XOR on '0' value.

In some embodiments, an input to soft decoders may be generated by optimally and coherently combining the failed codeword $y_0$ and the estimated codeword $y_{0\_EST}$. In some embodiments, such optimal coherently combined input to soft decoders is denoted by $y_{0,SB}$ and computed by:

$$y_{0,SB} = y_0 + y_{0\_EST} \quad \text{(Equation 8)}$$

Here, coherently combining codewords means combining the codewords (or LLRs thereof) with weights or coefficients that are determined based on confidence levels (or confident levels) of the codewords, instead of simply adding or summing the codewords. Also, optimally combining codewords (or LLRs thereof) means that the result of combination (e.g., new candidate codeword or an LLR thereof) is optimal in term of error correction capability of the new candidate codeword. In some embodiments, an optimal LLR can be calculated from LLRs of all of (decoding) failed codewords. In some embodiments, optimal coherently combined input to soft decoders may be generated by combining LLRs of the target codeword and the estimated codeword with weights or coefficients that are determined based on confidence levels of the target codeword and the estimated codeword. In some embodiments, a sub-optimal input to soft decoders may be generated by using minimum of LLRs to calculate the LLR of the estimated codeword (see Equation 11).

In some embodiments, soft information (e.g., LLRs) as input to soft decoders may be generated based on an optimal and coherent combination in a similar manner. For example, such optimally combined LLRs as input to soft decoders are denoted by $LLR_{0,SB}$ and are obtained by:

$$LLR_{0,SB} = LLR_0 + (x_1 \oplus x_2 \ldots |x_{k-1}|x_{k+1} \ldots \oplus x_n) \cdot LLR_k \qquad \text{(Equation 9)}$$

where $LLR_k$ is an LLR vector of the $k^{th}$ failed codeword $y_k$, and $LLR_0$ is an LLR vector of the failed target (original) codeword. In some embodiments, the RAID may be effectively used to estimate the failed target codeword (using Equation 7, for example), and combine LLRs of the estimated codeword with LLRs of the originally sampled target codeword.

Figure 8:
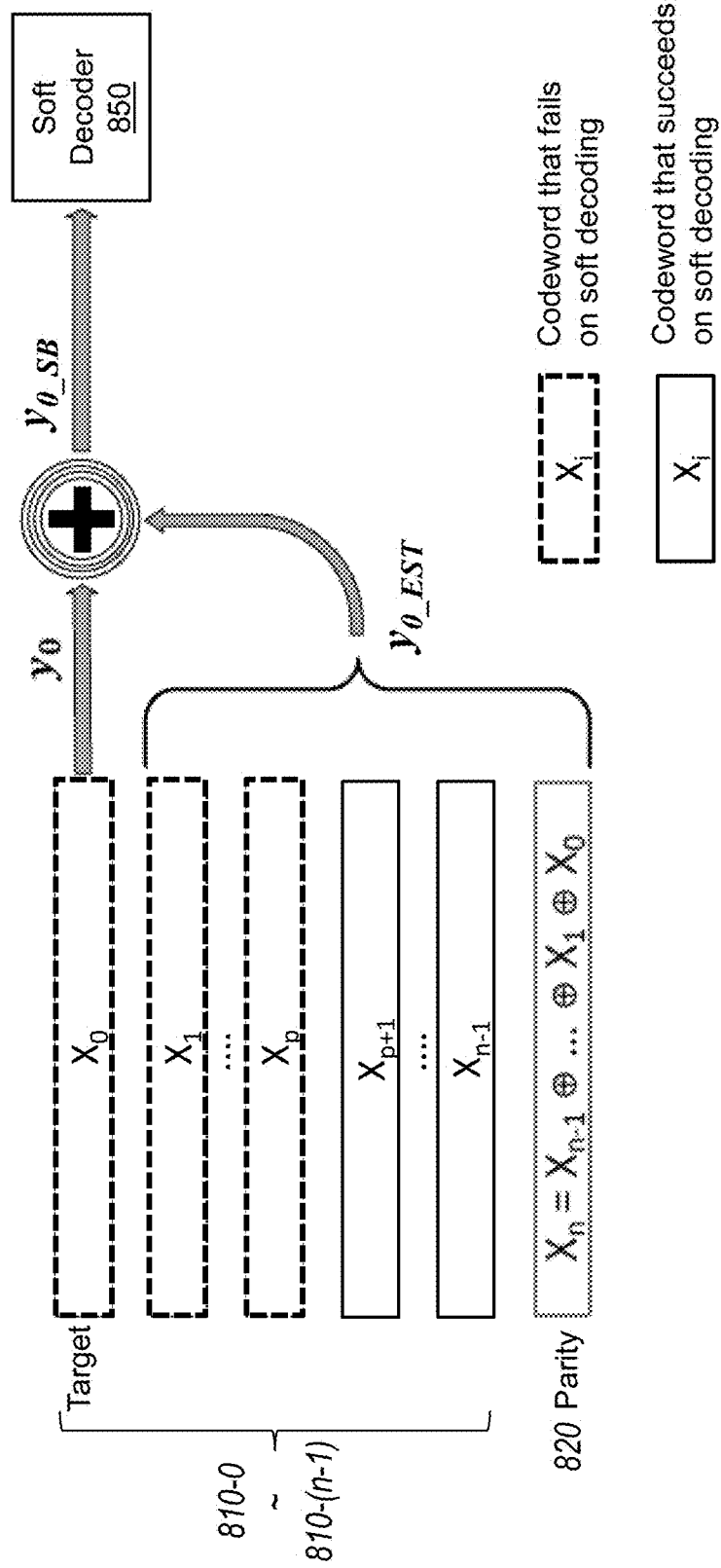
FIG. 8 illustrates another example process of generating soft information by combining soft information of a target codeword and soft information of an estimated codeword in a RAID system, according to some embodiments.

FIG. 8 illustrates another example process of generating soft information by combining soft information of a target codeword and soft information of an estimated codeword in a RAID system, according to some embodiments, which can perform any of the methods described in the present disclosure. As shown FIG. 8, soft information (e.g., LLRs) of the failed short codewords may be combined, such that nearly optimal LLR input can be provided to a soft-decoder (e.g., a soft decoder 850 in FIG. 7, the ECC decoder 512 in FIG. 5, the ECC decoder 612 in FIG. 6) and the soft decoder can perform soft decoding of the target codeword (e.g., $x_0$) more reliably than using soft information generated only based on the target codeword. The example illustrated in FIG. 7 can be extended to a case that multiple short codewords fail on soft decoding, as illustrated in FIG. 8. In this case, it is assumed, without loss of generality, that not only the target codeword $x_0$ but also codewords $x_1, \ldots, x_p$ have failed on soft decoding, while codewords $x_{p+1}, \ldots, x_n$ have been successfully decoded. It is noted that failed (noisy) versions of $x_0, x_1, \ldots, x_p$ are denoted by $y_0, y_1, \ldots, y_p$, respectively. In some embodiments, an estimated codeword $y_{0\_EST}$ may be generated or computed by combining failed codewords (as the RAID input) as follows:

$$y_{0\_EST} = (x_{p+1} \oplus x_{P+2} \ldots \oplus x_n) \cdot (y_1 + \ldots + y_p) \qquad \text{(Equation 10)}$$

In such case, LLRs which correspond to failed codewords $y_0, y_1, \ldots, y_p$ may be combined for computation of an estimated LLR of the failed codewords, denoted by $LLR_{0\_EST}$.

In some cases, the computation of LLR values corresponding to the coherently combined $y_{0\_EST}$ input may have a high complexity. In some embodiments, a sub-optimal low complexity method for computation of estimated LLR values for the RAID estimated target codeword may be provided. This method enables an effective hardware implementation with low gatecount compared to the optimal calculation of LLRs (e.g., LLRs calculated using Equation 9). In some embodiments, the absolute LLR value per bit for the estimated codeword ($LLR_{0\_EST}$) may be computed by:

$$|LLR_{0\_EST}| = \min(|LLR_1|, |LLR_p|) \qquad \text{(Equation 11)}$$

where $LLR_k$ is an LLR vector of the $k^{th}$ failed codeword $y_k$.

In some embodiments, the sign of the estimated LLR of the failed codewords ($LLR_{0\_EST}$) may be given by:

$$\text{sign}(LLR_{0\_EST}) = (x_{p+1} \oplus x_{P+2} \ldots \oplus x_n) \oplus \text{sign}(LLR_1) \oplus \text{sign}(LLR_2) \oplus \ldots \oplus \text{sign}(LLR_p) \qquad \text{(Equation 12)}$$

In some embodiments, estimated LLR values $LLR_{0\_SB}$ for a (new) candidate codeword (which represents the target codeword) may be calculated or computed based on the absolute value and sign of the estimated LLR ($LLR_{0\_EST}$), as follows:

$$LLR_{0,SB} = \{LLR_0 + w_1(p) \cdot \text{sign}(LLR_{0\_EST}) \cdot |LLR_{0\_EST}|\} \cdot w_2(p) \qquad \text{(Equation 13)}$$

where $w_1(p)$ is a weight which depends on the number of failed short codewords (e.g., $y_0, y_1, \ldots, y_p$ in FIG. 8), which is p in the example in FIG. 8. In some embodiments, the weight $w_1(p)$ may have a fixed optimized value. In some embodiments, the weight $w_1(p)$ may be a predetermined value. The motivation for using the weight $w_1(p)$ is that the more failed codewords the RAID has, the lower the reliability of the estimated LLR input (to a soft decoder) becomes. In addition, the external weight $w_2(p)$ may be a dynamic range scaling of LLR values as input for a soft decoder.

In some embodiments, the methods described in the above-described examples in FIG. 7 and FIG. 8 can be implemented for soft decoding in a RAID system and are referred to as "SB_RAID".

Figure 9A:
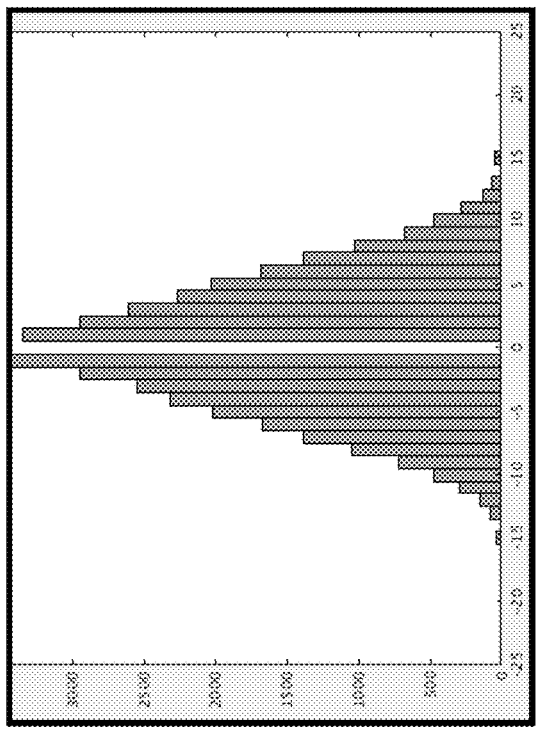
FIG. 9A, FIG. 9B and FIG. 9C illustrate example numerical values of soft information generated according to some embodiments.
Figure 9B:
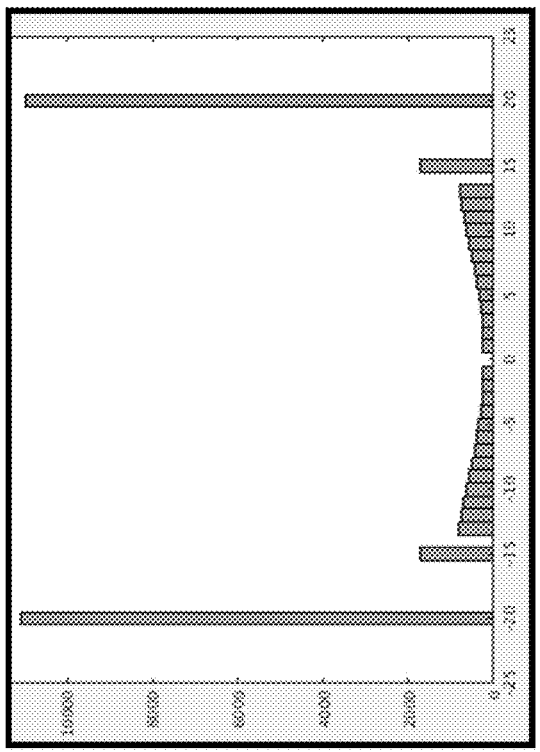
Figure 9C:
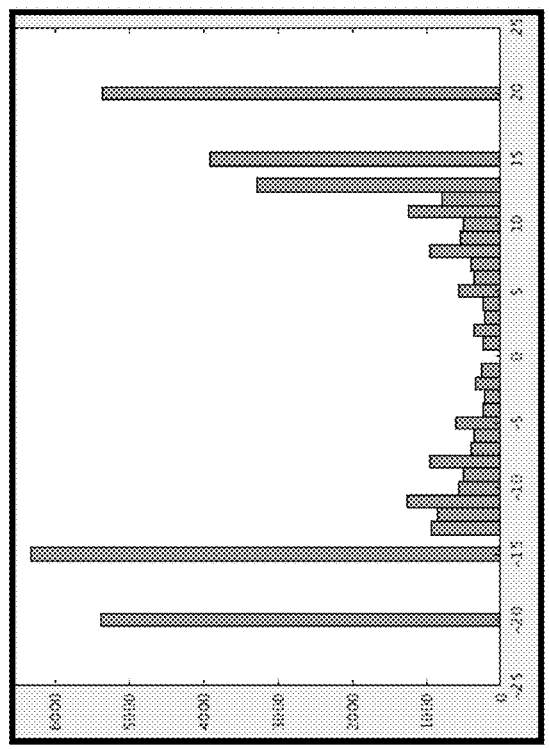

FIG. 9A, FIG. 9B and FIG. 9C illustrate example numerical values of soft information generated according to some embodiments. FIG. 9A shows a histogram of example LLR values of a (failed) target codeword. FIG. 9B shows a histogram of example LLR values of an estimated codeword which is built from 16 failed codewords using Equation 11. In obtaining the LLR values shown in FIGS. 9A and 9B, BER (bit error rate) for all codewords (i.e., the target code words and other codewords in RAID) is set to 0.025. FIG. 9C shows a histogram of example LLR values of a (new) candidate codeword calculated using Equation 13.

Figure 10:
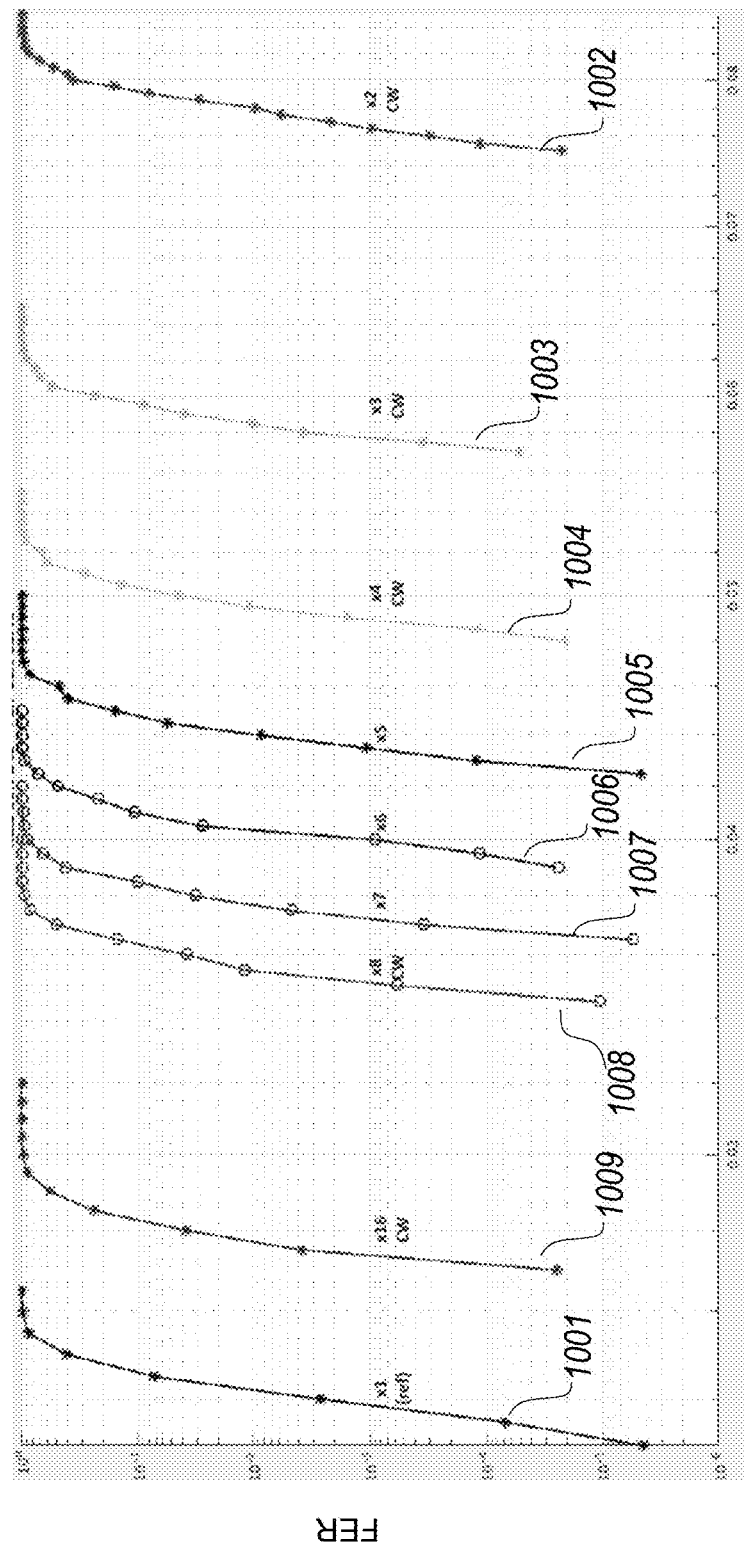
FIG. 10 is a diagram illustrating an example result of comparing a performance gain obtained with a conventional method with a performance gain obtained with a decoding method according to some embodiments.
Figures 11A, 11B:
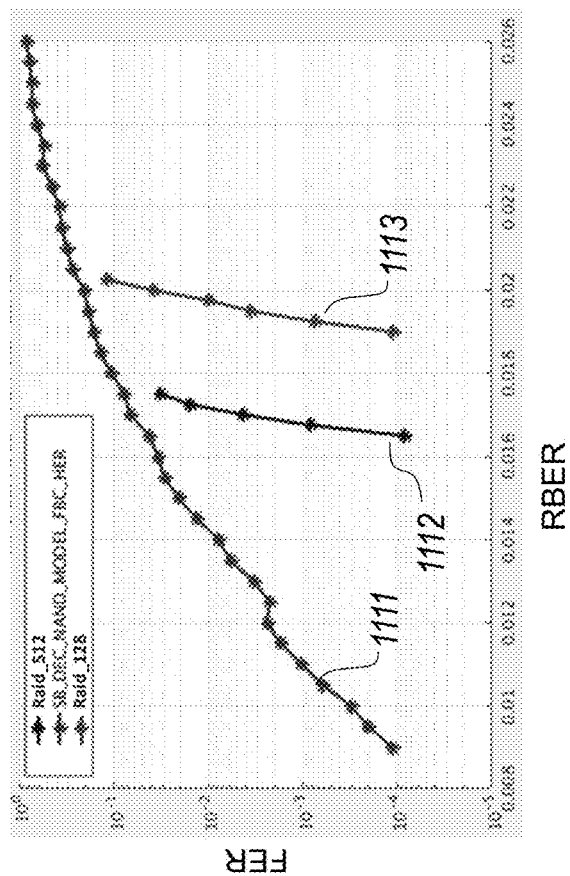
FIG. 11A and FIG. 11B are diagrams illustrating an example result of comparing performance gains obtained with decoding methods with various configurations according to some embodiments.

FIG. 10 is a diagram illustrating an example result of comparing a performance gain obtained with a conventional method with a performance gain obtained with a decoding method according to some embodiments (SB_RAID). FIG. 11A and FIG. 11B are diagrams illustrating an example result of comparing performance gains obtained with decoding methods with various configurations according to some embodiments. The x-axis in FIG. 10 to FIG. 11B is a residual bit error rate (RBER) used in a soft decoding, and the y-axis is a corresponding frame error rate (FER).

FIG. 10 shows the error correction capability of SB_RAID with different number of failed codewords in RAID with $w_1(p)=1$ and $w_2(p)=0.5$ (as an example of trivial selection of $w_1(p)$ and $w_2(p)$). For example, curves 1002, 1003, 1004, 1005, 1006, 1007, 1008 and 1009 shown in FIG. 10 corresponds to the error correction capability of SB_RAID with the number of failed codewords being 2, 3, 4, 5, 6, 7, 8 and 9, respectively. Curve 1001 indicates the error correction capability of a single codeword (i.e., simple soft decoding without using SB_RAID). In FIG. 10, it is assumed that at a specific BER point, all (short) codewords experience the same BER distribution, and each curve shows the error correction capability under different number of failed code-words which fail on soft decoding. It can be observed that the error correction capability of SB_RAID (e.g., the curves 1002-1009) is significantly improved over the simple soft decoding without using SB_RAID (e.g., the curve 1001).

FIG. 11A shows the impact of optimizing $w_1(p)$ and $w_2(p)$. In FIG. 11A, the curve 1101 indicates the error correction capability of soft decoding using a target codeword without RAID. The curve 1102 indicates the error correction capability of SB-RAID with $w_1(p)=1$ and $w_2(p)=0.5$, and the curve 1103 indicates the error correction capability of SB-RAID when optimized values for $w_1(p)$ and $w_2(p)$ are used. In some embodiments, optimized values for $w_1(p)$ and $w_2(p)$ may depend on channel conditions. For example, channel conditions can be represented by the number of failed codewords in RAID, an average BER, hard errors, if exists, and the like. In some embodiments, such optimization may be performed during a calibration process. In some embodiments, the calibration process may executed offline by extracting or determining weight values that can achieve improved error correction capabilities, based on various channel conditions. FIG. 11A shows that optimizing $w_1(p)$ and $w_2(p)$ according to channel conditions (e.g., the curve 1103) can improve the error correction capability of $LLR_{0,SB}$, which is LLRs of the new candidate codeword, over the error correction capability of $LLR_{0,SB}$ without such optimization (e.g., the curve 1102).

FIG. 11B shows an example of error correction capability as a function of RAID size (number of codewords in RAID). In FIG. 11B, the curve 1111 indicates the error correction capability of soft decoding using a target codeword without RAID. The curve 1112 indicates the error correction capability of SB-RAID with the number of codewords in RAID being 512, and curve 1113 indicates the error correction capability of SB-RAID with the number of codewords in RAID being 128. In some embodiments, there is a tradeoff between the total code rate $R_{raid}$, which depends on R (code rate for each (short) codeword) and n (number of codewords in RAID).

$$R_{raid} = \frac{n}{(n+1)} \cdot R \quad \text{(Equation 5)}$$

That is, as n becomes smaller, the probability for the number of codewords in the RAID that cannot be decoded successfully may decrease, thereby increasing the error correction capability of SB_RAID. On the other hand, as n becomes smaller, $R_{raid}$ may decrease, thereby requiring more bits of memory to be reserved to parity bits. FIG. 11B shows that a smaller number of codewords in RAID (e.g., the curve 1113) can improve the error correction capability of $LLR_{0,SB}$ over the error correction capability of $LLR_{0,SB}$ with a large number of codewords in RAID (see the curve 1112).

It is noted that BER distributions experienced by codewords in FIGS. 11A and 11B are configured to be different from BER distributions experienced by codewords in FIG. 10. In FIG. 10, it is assumed that at a specific BER point, all (short) codewords experience the same BER distribution. On the other hand, in FIG. 11A and FIG. 11B, it is assumed that at a specific BER point, all (short) codewords experience the same average BER distribution. Therefore, the single codeword soft-decoding in FIG. 10 and the single codeword soft-decoding in FIGS. 11A and 11B have different error correction capability. Simulations in FIG. 10 are more theoretical (because all codewords have exactly the same BER), while simulations in FIGS. 11A and 11B (using "channel model") intend to represent a more realistic scenario, in which the actual BER in each BER point has some distribution.

Embodiments of the present disclosure are not limited to the above-described method (SB_RAID). In some embodiments, the target codeword $x_0$ is not necessarily the first codeword in RAID. In some embodiments, $y_1 \ldots y_p$ are not necessarily consecutive in RAID, and $y_{p+1} \ldots y_n$ are not necessarily consecutive in RAID.

In some embodiments, when a target codeword fails on soft decoding and some (other) codewords in RAID fail on soft decoding, the failed codewords may be partial decoded, e.g., only a portion of all the failed codewords may be decoded. Here, "partially decoding" means decoding (or fixing) some bits of a single failed codeword. If some bits can be fixed in the short codeword, although it is useless for the short codeword, such partially decoding or fixing may help the RAID decoding. Generally, partial soft decoding is useless, since only in case that the full code-word could be decoded successfully, it means that all errors are fixed. In SB_RAID, the short code-words decoding and the RAID decoding are mutually used, and thus it is useful to partially correct some of the code-words, or improve its LLR comparing to its original LLR as sampled from the channel, since this process may improve the total capability of SB_RAID.

In some embodiments, a flash memory system (e.g., the flash memory system 500 in FIG. 5, the flash memory system 600 in FIG. 6) may include a flash memory (e.g., flash memory module 504 in FIG. 5, flash memory module 604 in FIG. 6) and a circuit (e.g., memory controller 502 or read circuit 510 in FIG. 5, memory controller 602 or read circuit 610 or RAID controller 640 in FIG. 6, soft decoder 750 in FIG. 7, soft decoder 850 in FIG. 8) for decoding a result of a read operation on the flash memory using a first codeword (e.g., codeword $x_0$ in FIG. 8). The circuit may be configured to generate first soft information of the first codeword (e.g., the LLR value $LLR_0$ in Equation 13). The circuit may be further configured to generate second soft information (e.g., the estimated LLR values $LLR_{0\_EST}$ in Equation 13) of a second codeword (e.g., failed codewords $y_1, \ldots, y_p$ in Equation 10). The circuit may be configured to generate third soft information (e.g., estimated LLR values for a candidate codeword $LLR_{0\_SB}$ in Equation 13) based on the first soft information (e.g., $LLR_0$ in Equation 13) and the second soft information (e.g., $LLR_{0\_EST}$ in Equation 13). The circuit may be configured to decode the result of the read operation on the flash memory using the third soft information (e.g., $LLR_{0\_SB}$ may be provided as input to a soft decoder (e.g., soft decoder 750 in FIG. 7 or soft decoder 850 in FIG. 8) so as to decode the new codeword $y_{0,SB}$).

In some embodiments, the flash memory system may further include a redundant array of inexpensive disks (RAID) of the flash memory (e.g., flash memory module 604 including RAID in FIG. 6). The second codeword may be a plurality of codewords (e.g., $y_1 \ldots y_p$ in Equation 10) other than the first codeword in the RAID of the flash memory.

In some embodiments, the first soft information may include log-likelihood ratio (LLR) values of the first codeword (e.g., $LLR_0$ in Equation 13). The second soft information may include LLR values of the second codeword (e.g., $LLR_{0\_EST}$ in Equation 13).

Figure 12:
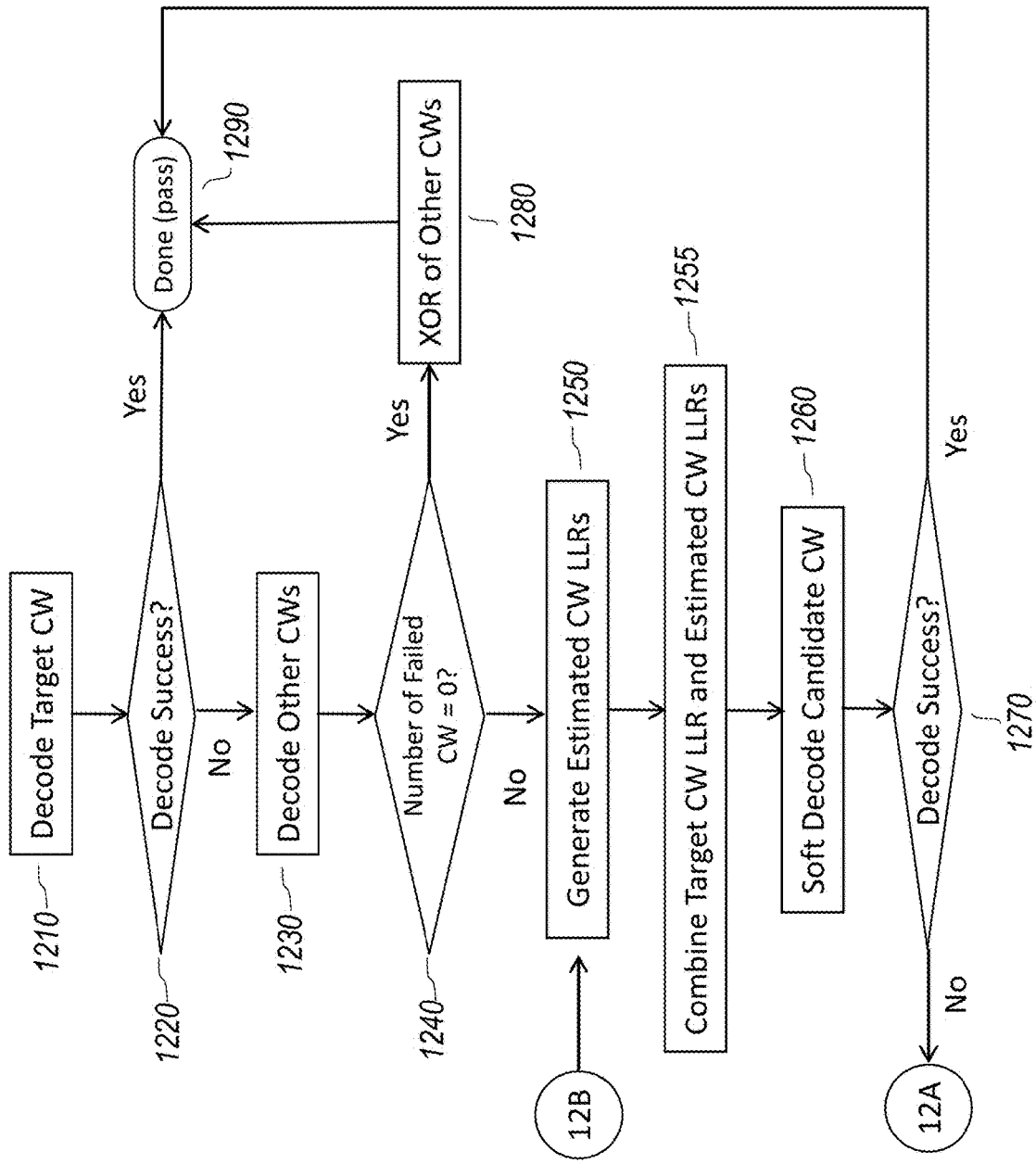
FIG. 12 and FIG. 13 are a flowchart illustrating an example methodology for soft decoding a result of a read operation on a flash memory by combining soft information of a target codeword and soft information of an estimated codeword, according to some embodiments.

In some embodiments, in generating first soft information, the circuit may be configured to determine whether the first codeword fails or succeeds in decoding in the flash memory (e.g., step S1220 in FIG. 12), and generate, in response to determining that the first codeword fails in decoding, the first soft information (e.g., $LLR_0$ in Equation 13) of the first codeword (e.g., step S1260 in FIG. 12).

In some embodiments, the second codeword may include at least one failed codeword (e.g., $y_1, \ldots, y_p$ in Equation 10) other than the first codeword that fails in decoding in the flash memory, and at least one successful codeword (e.g., $x_{p+1}, \ldots, x_n$ in Equation 10) other than the first codeword that succeeds in decoding in the flash memory. In generating second soft information, the circuit may be configured to generate the second soft information based on a result of XOR operations on the at least one successful codeword (e.g., $(x_{p+1} \oplus x_{P+2} \ldots \oplus x_n)$ in Equation 12). In generating second soft information, the circuit may be configured to generate the second soft information based on soft information of a sum of the at least one failed codeword (e.g., $(y_1 + \ldots + y_p)$ in Equation 10). In generating second soft information, the circuit may be configured to generate the second soft information based on a minimum of soft information of the at least one failed codeword (e.g., min $(|LLR_1|, \ldots, |LLR_p|)$ in Equation 11). In generating second soft information, the circuit may be configured to calculate an absolute value of the second soft information (e.g., $|LLR_{0\_EST}|$ in Equation 11) based on the minimum of soft information of the at least failed codeword (e.g., min $(|LLR_1|, \ldots, |LLR_p|)$ in Equation 11), and calculate a sign of the second soft information (e.g., sign($LLR_{0\_EST}$) in Equation 12) based on a sign of a result of XOR operations on the at least one successful codeword and a sign of soft information of the at least one failed codeword (e.g., $(x_{p+1} \oplus x_{P+2} \oplus x_n) \oplus \text{sign}(LLR_1) \oplus \text{sign}(LLR_2) \oplus \ldots \oplus \text{sign}(LLR_p)$ in Equation 12).

In some embodiments, in generating third soft information, the circuit may be configured to generate the third soft information by calculating a weighted sum of the first soft information and the second soft information (e.g., a weighted sum using the weights $w_1(p)$ and $w_2(p)$ in Equation 13).

Figure 13:
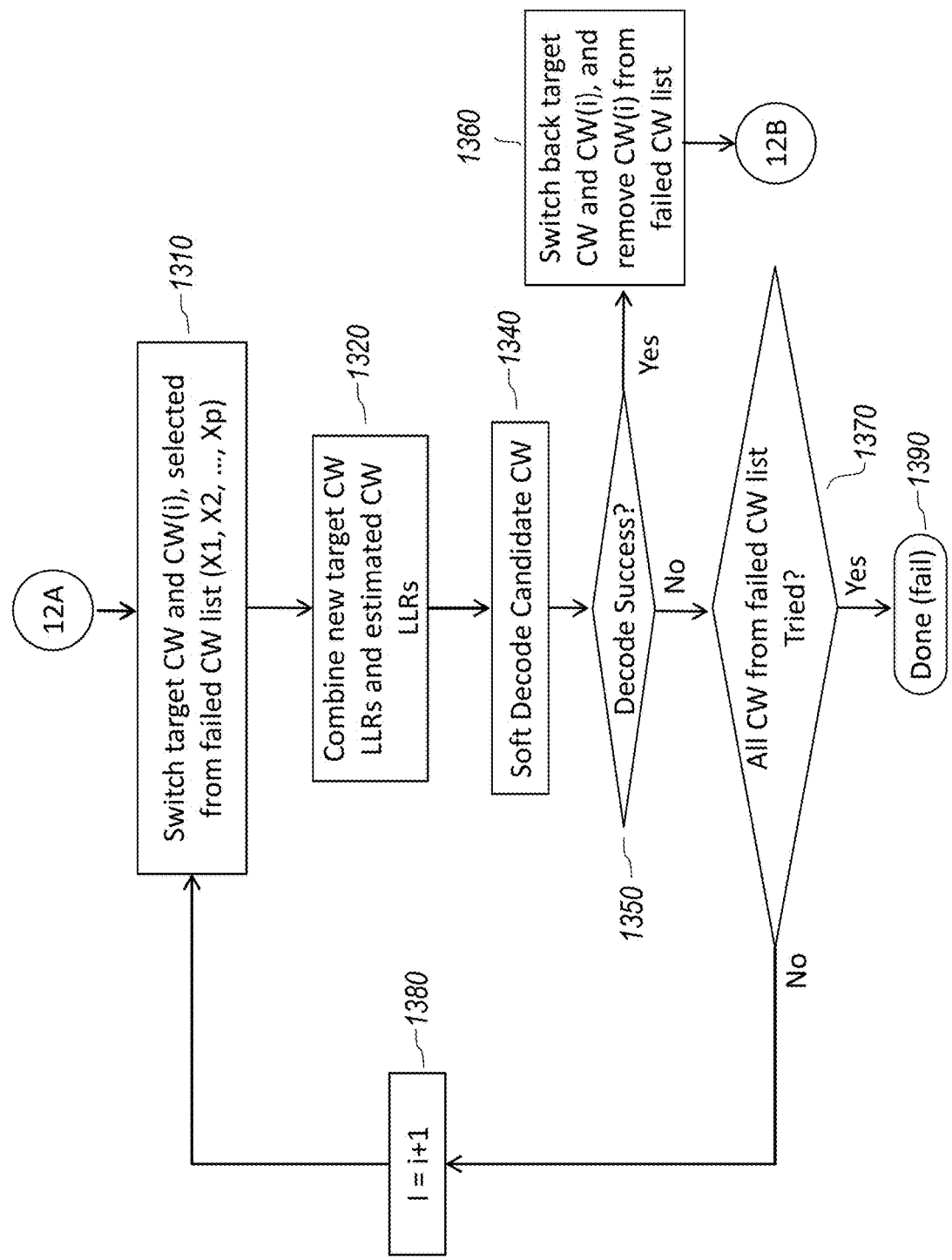

FIG. 12 and FIG. 13 are a flowchart illustrating an example methodology for soft decoding a result of a read operation on a flash memory by combining soft information of a target codeword and soft information of an estimated codeword, according to some embodiments. The example methodology shown in FIG. 12 and FIG. 13 (hereinafter "Re-ordering SB_RAID") uses dynamic re-order (or successive-raid-decoding) of RAID codewords in order to improve the overall error correction capability of soft decoding according to some embodiments.

In this example, referring to FIG. 12, the process begins in step S1210 by attempting to perform soft decoding on a target codeword (e.g., $x_0$ in FIG. 8) among a plurality of codewords in RAID (e.g., $x_0, \ldots, x_n$ in FIG. 8). In step S1220, in some embodiments, it may be determined whether the target codeword fails on soft decoding ("No") or the target codeword succeeds on soft decoding ("Yes"). If "Yes", the process may complete in step S1290 because the target codeword has passed soft decoding. If "No", the process may proceed to step S1230.

In step S1230, in some embodiments, it may be attempted to perform soft decoding on codewords other than the target codeword (e.g., $x_1, \ldots, x_n$ in FIG. 8). In step S1240, in some embodiments, it may be determined whether the number of failed codewords is zero ("Yes") or is greater than zero ("No"). If "Yes", the process may proceed to step S1280 to perform RAID decoding by XOR operations on all the codewords other than the target codeword (e.g., $x_1, \ldots, x_{n-1}$ in FIG. 8) and then the process may proceed to step S1290 to complete. If "No", the process may proceed to step S1250.

In step S1250, in some embodiments, LLR values for the RAID estimated target codeword may be calculated or computed. In some embodiments, estimated LLR values may be calculated using Equation 11 and Equation 12 (reproduced below).

$$|LLR_{0\_EST}| = \min(|LLR_1|, \ldots, |LLR_p|) \quad \text{(Equation 11)}$$

$$\text{sign}(LLR_{0\_EST}) = (x_{p+1} \oplus x_{P+2} \ldots \oplus x_n) \oplus \text{sign}(LLR_1) \\ \oplus \text{sign}(LLR_2) \oplus \ldots \oplus \text{sign}(LLR_p) \quad \text{(Equation 12)}$$

where $LLR_k$ is an LLR vector of the $k^{th}$ failed codeword $y_k$ and $x_{p+1}, \ldots, x_n$ are codewords that are successfully soft coded.

In step S1255, in some embodiments, LLR values for a candidate codeword ($LLR_{0\_SB}$) may be calculated or computed using Equation 13 (reproduced below).

$$LLR_{0,SB} = \{LLR_0 + w_1(p) \cdot \text{sign} \\ (LLR_{0\_EST}) \cdot |LLR_{0\_EST}|\} \cdot w_2(p) \quad \text{(Equation 13)}$$

where $w_1(p)$ is a weight which depends on the number of failed short codewords (e.g., $y_0, y_1, \ldots, y_p$ in FIG. 8), and the external weight $w_2(p)$ may be a dynamic range scaling of LLR values as input for a soft decoder.

In step S1260, in some embodiments, it may be attempted to perform soft decoding on the candidate codeword computed in step S1255. In step S1270, in some embodiments, it may be determined whether the candidate codeword fails on soft decoding ("No") or the candidate codeword succeeds on soft decoding ("Yes"). If "Yes", the process may complete in step S1290 because the candidate codeword has passed soft decoding. If "No", the process may proceed to step S1310 (see FIG. 13).

Referring to FIG. 13, in step S1310, a codeword CW(i) may be selected from among a failed codeword list (e.g., $\{y_1, y_2, \ldots, y_p\}$) and the target codeword may be switched to the selected codeword CW(i).

In step S1320, in some embodiments, LLR values for the estimated target codeword may be calculated or computed based on the new target codeword CW(i). For example, if i=1, and $y_1$ is a (new) failed target codeword that fails on soft decoding, $y_0, y_2, \ldots, y_p$ are failed codewords that fail on soft decoding, and $x_{p+1}, \ldots, x_n$ are codewords that are successfully soft coded, the absolute value and sign of the LLR values for the estimated target codeword may be computed by:

$$|LLR_{1\_EST}| = \min(|LLR_0|, \ldots, |LLR_p|) \quad \text{(Equation 14)}$$

$$\text{sign}(LLR_{1\_EST}) = (x_{p+1} \oplus x_{P+2} \ldots \oplus x_n) \oplus \text{sign} \\ (LLR_0) \oplus \text{sign}(LLR_2) \oplus \ldots \oplus \text{sign}(LLR_p) \quad \text{(Equation 15)}$$

In step S1330, in some embodiments, LLR values for a (new) candidate codeword ($LLR_{1\_SB}$) may be calculated or computed by $$LLR_{0,SB} = \{LLR_1 + w_1(p) \cdot \text{sign} \\ (LLR_{1\_EST}) \cdot |LLR_{1\_EST}|\} \cdot w_2(p) \quad \text{(Equation 16)}$$

In step S1340, in some embodiments, it may be attempted to perform soft decoding on the (new) candidate codeword using the LLR values computed in step S1330 (e.g., $LLR_{1\_SB}$). In step S1350, in some embodiments, it may be determined whether the (new) candidate codeword fails on soft decoding ("No") or the (new) candidate codeword succeeds on soft decoding ("Yes"). If "Yes", the process may switch back the (original) target codeword with CW(i), and remove CW(i) from the failed codeword list in step S1360 and may proceed to step 1250 (see FIG. 12). In some embodiments, the removed CW(i) may be added to a fixed codeword list. For example, if i=1, after removing CW(1), the list fixed codeword list is $\{x_1, x_{p+1}, x_{p+2}, \ldots, x_n\}$, and the failed codeword list is $\{y_2, y_3, \ldots, y_p\}$. If "No", the process may proceed to step S1370 (see FIG. 13).

In step S1370, in some embodiments, it may be determined whether all codewords from the failed codeword list have been switched with the target codeword ("Yes") or there remain any codeword in the failed codeword list that has not been switched with the target codeword ("No"). If "Yes", the process may complete in step S1390 because the target codeword has failed on decoding. If "No", the process may increase the value of i to select another codeword from the failed codeword list, and then repeat steps 1310 through 1370 until all codewords from the failed codeword list have been switched with the target codeword.

The error correction capability of the Re-ordering SB_RAID method (as shown in FIG. 12 and FIG. 13) is improved over the original SB_RAID method for the following reasons. When the new candidate codeword (or LLR values thereof) cannot be successfully decoded (i.e., "No" in step 1270), the target codeword $y_0$ is switched with the codeword $y_1$ as a new candidate codeword, and SB_RAID is performed again (in steps 1310 through 1350 in FIG. 13). If the soft decoding of this new candidate codeword is decoded successfully, and then $y_1$ can be removed from the failed codeword list in step 1360. In this manner, the number of failed codewords in RAID can be reduced by one, thereby SB_RAID with a reduced set of failed codewords in RAID may likely complete successfully. Thus, the error correction capability of the Re-ordering SB_RAID method (as shown in FIG. 12 and FIG. 13) is improved over the original SB_RAID method.

Figure 14:
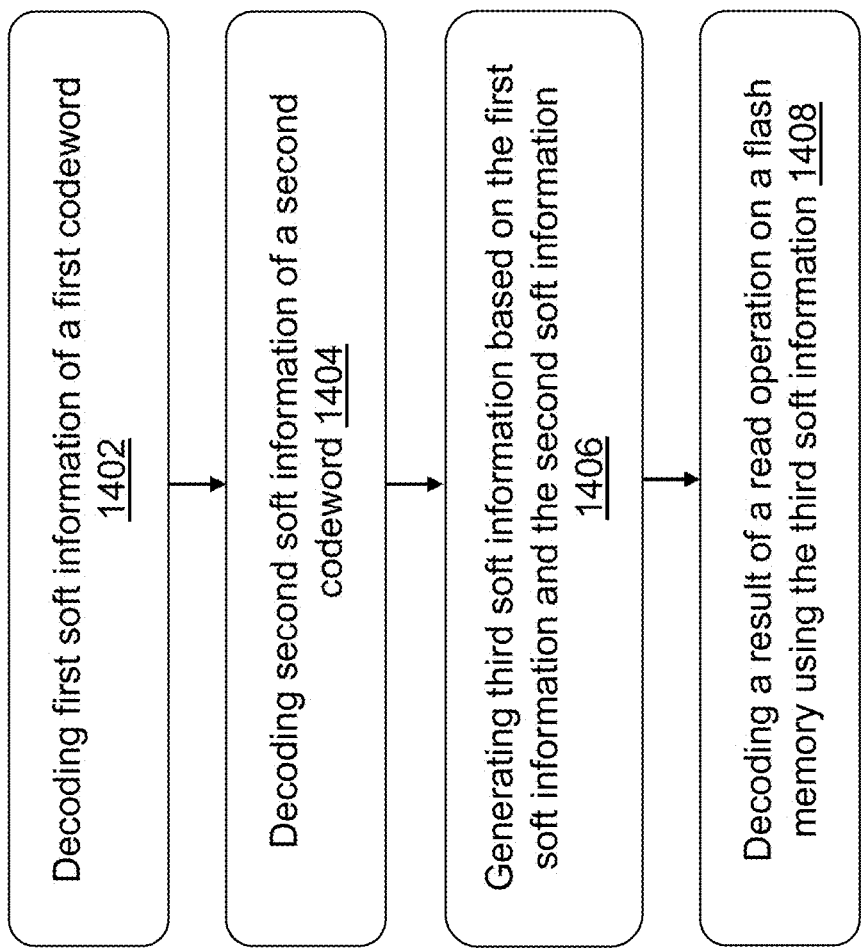
FIG. 14 is a flowchart illustrating an example methodology for decoding a result of a read operation on a flash memory by combining soft information of a target codeword and soft information of an estimated codeword, according to some embodiments.

FIG. 14 is a flowchart illustrating an example methodology for decoding a result of a read operation on a flash memory by combining soft information of a target codeword and soft information of an estimated codeword, according to some embodiments. In some embodiments, the example methodology relates to a method for decoding a result of a read operation on a flash memory (e.g., flash memory module 504 in FIG. 5, flash memory module 604 in FIG. 6) using a first codeword (e.g., codeword $x_0$ in FIG. 7 and FIG. 8).

In this example, the process begins in step S1402 by generating first soft information (e.g., the LLR value $LLR_0$ in Equation 13) of the first codeword (e.g., codeword $x_0$ in FIG. 8). In some embodiments, the first soft information may include log-likelihood ratio (LLR) values of the first codeword (e.g., $LLR_0$ in Equation 13).

In some embodiments, in generating first soft information, it may be determined whether the first codeword fails or succeeds in decoding in the flash memory (e.g., step S1220 in FIG. 12). In response to determining that the first codeword fails in decoding, the first soft information (e.g., $LLR_0$ in Equation 13) of the first codeword may be generated (e.g., step S1260 in FIG. 12).

In step S1404, in some embodiments, second soft information (e.g., the estimated LLR values $LLR_{0\_EST}$ in Equation 13) of a second codeword (e.g., failed codewords $y_1, \ldots, y_p$ in Equation 10) may be generated. In some embodiments, the second codeword may be a plurality of codewords other than the first codeword in a redundant array of inexpensive disks (RAID) of the flash memory (e.g., flash memory module 604 including RAID in FIG. 6). In some embodiments, the second soft information may include LLR values of the second codeword (e.g., $LLR_{0\_EST}$ in Equation 13).

In some embodiments, the second codeword may include at least one failed codeword (e.g., $y_1, \ldots, y_p$ in Equation 10) other than the first codeword that fails in decoding in the flash memory, and at least one successful codeword (e.g., $x_{p+i}, \ldots, x_n$ in Equation 10) other than the first codeword that succeeds in decoding in the flash memory. In generating second soft information, the second soft information may be generated based on a result of XOR operations on the at least one successful codeword (e.g., $(x_{p+1} \oplus x_{P+2} \ldots \oplus x_n)$ in Equation 12). In generating second soft information, the second soft information may be generated based on soft information of a sum of the at least one failed codeword (e.g., $(y_1 + \ldots + y_p)$ in Equation 10). In generating second soft information, the second soft information may be generated based on a minimum of soft information of the at least one failed codeword (e.g., $\min(|LLR_1|, \ldots, |LLR_p|)$ in Equation 11). In generating second soft information, an absolute value of the second soft information (e.g., $|LLR_{0_{EST}}|$ in Equation 11) may be calculated based on the minimum of soft information of the at least failed codeword (e.g., $\min(|LLR_1|, |LLR_p|)$ in Equation 11), and a sign of the second soft information (e.g., $\text{sign}(LLR_{0_{EST}})$ in Equation 12) may be calculated based on a sign of a result of XOR operations on the at least one successful codeword and a sign of soft information of the at least one failed codeword (e.g., $(x_{p+1} \oplus x_{P+2} \ldots \oplus x_n) \oplus \text{sign}(LLR_1) \oplus \text{sign}(LLR_2) \oplus \ldots \oplus \text{sign}(LLR_p)$ in Equation 12).

In step S1406, in some embodiments, third soft information (e.g., estimated LLR values for a candidate codeword $LLR_{0\_SB}$ in Equation 13) may be generated based on the first soft information (e.g., $LLR_0$ in Equation 13) and the second soft information (e.g., $LLR_{0\_EST}$ in Equation 13). In some embodiments, in generating third soft information, the third soft information may generated by calculating a weighted sum of the first soft information and the second soft information (e.g., a weighted sum using the weights $w_1$ (p) and $w_2$ (p) in Equation 13).

In step S1408, in some embodiments, the result of the read operation on the flash memory may be decoded using the third soft information. For example, $LLR_{0\_SB}$ calculated using Equation 13 may be provided as input to a soft decoder (e.g., soft decoder 750 in FIG. 7 or soft decoder 850 in FIG. 8) so as to decode the new codeword $y_{0,SB}$.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for decoding a result of a read operation on a flash memory using a first codeword, the method comprising:
   generating first soft information of the first codeword;
   generating second soft information of a second codeword;
   generating third soft information based on the first soft information and the second soft information; and
   decoding the result of the read operation on the flash memory using the third soft information.

2. The method of claim 1, wherein the second codeword is a plurality of codewords other than the first codeword in a redundant array of inexpensive disks (RAID) of the flash memory.

3. The method of claim 1, wherein
   the first soft information comprises log-likelihood ratio (LLR) values of the first codeword, and
   the second soft information comprises LLR values of the second codeword.

4. The method of claim 1, wherein generating first soft information comprises:
   determining whether the first codeword fails or succeeds in decoding in the flash memory; and
   in response to determining that the first codeword fails in decoding, generating the first soft information of the first codeword.

5. A method for decoding a result of a read operation on a flash memory using a first codeword, the method comprising:
generating first soft information of the first codeword;
generating second soft information of a second codeword;
generating third soft information based on the first soft information and the second soft information; and
decoding the result of the read operation on the flash memory using the third soft information, wherein the second codeword comprises:
at least one failed codeword other than the first codeword that fails in decoding in the flash memory; and
at least one successful codeword other than the first codeword that succeeds in decoding in the flash memory.

6. The method of claim 5, wherein generating second soft information comprises:
generating the second soft information based on a result of XOR operations on the at least one successful codeword.

7. The method of claim 5, wherein generating second soft information comprises:
generating the second soft information based on soft information of a sum of the at least one failed codeword.

8. The method of claim 5, wherein generating second soft information comprises:
generating the second soft information based on a minimum of soft information of the at least one failed codeword.

9. The method of claim 8, wherein generating second soft information comprises:
calculating an absolute value of the second soft information based on the minimum of soft information of the at least failed codeword; and
calculating a sign of the second soft information based on a sign of a result of XOR operations on the at least one successful codeword and a sign of soft information of the at least one failed codeword.

10. The method of claim 1, wherein generating third soft information comprises:
generating the third soft information by calculating a weighted sum of the first soft information and the second soft information.

11. A flash memory system comprising:
a flash memory; and
a circuit for decoding a result of a read operation on the flash memory using a first codeword, the circuit being configured to:
generate first soft information of the first codeword;
generate second soft information of a second codeword;
generate third soft information based on the first soft information and the second soft information; and
decode the result of the read operation on the flash memory using the third soft information.

12. The flash memory system of claim 11, further comprising:
a redundant array of inexpensive disks (RAID) of the flash memory,
wherein the second codeword is a plurality of codewords other than the first codeword in the RAID of the flash memory.

13. The flash memory system of claim 11, wherein
the first soft information comprises log-likelihood ratio (LLR) values of the first codeword, and
the second soft information comprises LLR values of the second codeword.

14. The flash memory system of claim 13, wherein in generating first soft information, the circuit is configured to:
determine whether the first codeword fails or succeeds in decoding in the flash memory; and
generate, in response to determining that the first codeword fails in decoding, the first soft information of the first codeword.

15. The flash memory system of claim 11, wherein the second codeword comprises:
at least one failed codeword other than the first codeword that fails in decoding in the flash memory; and
at least one successful codeword other than the first codeword that succeeds in decoding in the flash memory.

16. The flash memory system of claim 15, wherein in generating second soft information, the circuit is configured to:
generate the second soft information based on a result of XOR operations on the at least one successful codeword.

17. The flash memory system of claim 15, wherein in generating second soft information, the circuit is configured to:
generate the second soft information based on soft information of a sum of the at least one failed codeword.

18. The flash memory system of claim 15, wherein in generating second soft information, the circuit is configured to:
generate the second soft information based on a minimum of soft information of the at least one failed codeword.

19. The flash memory system of claim 18, wherein in generating second soft information, the circuit is configured to:
calculate an absolute value of the second soft information based on the minimum of soft information of the at least failed codeword; and
calculate a sign of the second soft information based on a sign of a result of XOR operations on the at least one successful codeword and a sign of soft information of the at least one failed codeword.

20. The flash memory system of claim 11, wherein in generating third soft information, the circuit is configured to:
generate the third soft information by calculating a weighted sum of the first soft information and the second soft information.

* * * * *